(12) United States Patent
Wang et al.

(10) Patent No.: US 11,592,894 B2
(45) Date of Patent: Feb. 28, 2023

(54) INCREASING POWER EFFICIENCY FOR AN INFORMATION HANDLING SYSTEM

(71) Applicant: Dell Products L.P., Round Rock, TX (US)

(72) Inventors: Isaac Q. Wang, Austin, TX (US); Lee B. Zaretsky, Pflugerville, TX (US)

(73) Assignee: Dell Products L.P., Round Rock, TX (US)

(*) Notice: Subject to any disclaimer, the term of this patent is extended or adjusted under 35 U.S.C. 154(b) by 94 days.

(21) Appl. No.: 17/228,061

(22) Filed: Apr. 12, 2021

(65) Prior Publication Data
US 2022/0326758 A1    Oct. 13, 2022

(51) Int. Cl.
*G06F 1/3296* (2019.01)
*G06F 1/26* (2006.01)
*G06F 11/34* (2006.01)
*G06F 11/30* (2006.01)
*G06F 1/3225* (2019.01)
G06F 13/16 (2006.01)
G06N 20/00 (2019.01)

(52) U.S. Cl.
CPC ........... *G06F 1/3296* (2013.01); *G06F 1/266* (2013.01); *G06F 1/3225* (2013.01); *G06F 11/3034* (2013.01); *G06F 11/3058* (2013.01); *G06F 11/3495* (2013.01); *G06F 13/1668* (2013.01); *G06N 20/00* (2019.01)

(58) Field of Classification Search
CPC ...... G06F 1/266; G06F 1/3203; G06F 1/3206; G06F 1/3221; G06F 1/3225; G06F 1/3256; G06F 1/3268; G06F 1/3275; G06F 1/3296; G06F 11/3034; G06F 11/3037; G06F 11/3058; G06F 11/3062; G06F 11/3495; G06F 13/1668
See application file for complete search history.

(56) References Cited

U.S. PATENT DOCUMENTS

| | | | |
|---|---|---|---|
| 7,581,125 B2* | 8/2009 | Ranganathan | G06F 1/3296 713/340 |
| 8,429,436 B2* | 4/2013 | Fillingim | G06F 11/3034 713/320 |
| 10,241,701 B2* | 3/2019 | Choi | G06F 3/0625 |

(Continued)

*Primary Examiner* — Thomas J. Cleary
(74) *Attorney, Agent, or Firm* — McDermott Will & Emery LLP

(57) ABSTRACT

In one embodiment, a method for increasing power efficiency for an information handling system includes: monitoring, by a host service, one or more performance metrics associated with a memory device of the information handling system, the memory device including a power controller communicably coupled to a management device via a side-band bus; predicting, by the host service, an energy requirement for the memory device based on the one or more performance metrics; generating, by the host service, a power configuration profile based on the energy requirement, the power configuration profile indicating one or more power controller parameters associated with the power controller; sending, by the host service, the power configuration profile to the management device; receiving, by the management device, the power configuration profile; and modifying, by the management device and via the side-band bus, the one or more power controller parameters based on the power configuration profile.

17 Claims, 3 Drawing Sheets

(56) References Cited

U.S. PATENT DOCUMENTS

| | | | |
|---|---|---|---|
| 2006/0288241 A1* | 12/2006 | Felter | G06F 1/3203 |
| | | | 713/300 |
| 2007/0262132 A1* | 11/2007 | Burton | G06F 1/26 |
| | | | 235/375 |
| 2007/0283178 A1* | 12/2007 | Dodeja | G06F 1/3203 |
| | | | 713/324 |
| 2008/0106248 A1* | 5/2008 | Qahouq | G06F 1/26 |
| | | | 323/318 |
| 2010/0005326 A1* | 1/2010 | Archer | G06F 1/32 |
| | | | 713/320 |
| 2011/0066840 A1* | 3/2011 | Bandholz | G06F 1/3203 |
| | | | 711/E12.008 |
| 2011/0144818 A1* | 6/2011 | Li | G06F 1/26 |
| | | | 700/291 |
| 2013/0046967 A1* | 2/2013 | Fullerton | H03L 7/0997 |
| | | | 713/100 |
| 2014/0006808 A1* | 1/2014 | Sizikov | G05F 3/08 |
| | | | 327/540 |
| 2014/0149761 A1* | 5/2014 | Allen-Ware | G06F 1/3206 |
| | | | 713/320 |
| 2015/0177814 A1* | 6/2015 | Bailey | G06F 1/3296 |
| | | | 713/320 |
| 2016/0077571 A1* | 3/2016 | Sagar | G06F 1/3243 |
| | | | 713/340 |
| 2017/0251433 A1* | 8/2017 | Evangelinakis | G06F 1/3206 |
| 2018/0173285 A1* | 6/2018 | Rotbard | G11C 5/148 |
| 2019/0065089 A1* | 2/2019 | Myers | G06F 3/0625 |
| 2019/0163250 A1* | 5/2019 | Lee | G06F 1/3206 |
| 2019/0272012 A1* | 9/2019 | Kachare | G06F 1/3221 |

\* cited by examiner

INCREASING POWER EFFICIENCY FOR AN INFORMATION HANDLING SYSTEM

BACKGROUND

Field of the Disclosure

The disclosure relates generally to information handling systems, and in particular to increasing power efficiency for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a method for increasing power efficiency for an information handling system includes: monitoring, by a host service of a processor subsystem of the information handling system, one or more performance metrics associated with a memory device of the information handling system, the memory device including a power controller communicably coupled to a management device of the information handling system via a side-band bus; predicting, by the host service, an energy requirement for the memory device based on the one or more performance metrics; generating, by the host service, a power configuration profile based on the energy requirement, the power configuration profile indicating one or more power controller parameters associated with the power controller; sending, by the host service, the power configuration profile to the management device; receiving, by the management device, the power configuration profile; and modifying, by the management device and via the side-band bus, the one or more power controller parameters based on the power configuration profile to cause an increased power efficiency for the information handling system.

In one or more of the disclosed embodiments, modifying the one or more power controller parameters includes: accessing, by the management device, a memory of the power controller via the side-band bus; and storing, by the management device, one or more commands associated with the power configuration profile into the memory of the power controller.

In one or more of the disclosed embodiments, the method further includes: identifying, by the management device, an output voltage of a voltage regulator of the information handling system, the voltage regulator communicably coupled to the power controller; determining, by the management device, that the output voltage is outside of a threshold output voltage; and modifying, by the management device, one or more voltage regulator parameters of the voltage regulator to cause an increase or decrease in the output voltage.

In one or more of the disclosed embodiments, modifying the one or more voltage regulator parameters includes: accessing, by the management device, a memory of the voltage regulator via the side-band bus; and storing, by the management device, one or more commands associated with the power configuration profile into the memory of the voltage regulator.

In one or more of the disclosed embodiments, monitoring the one or more performance metrics associated with the memory device includes: accessing, by the host service, one or more performance counters associated with the memory device; and determining, by the host service, a memory usage of the memory device based on the performance counters, the memory usage indicating a frequency in which the memory device is accessed.

In one or more of the disclosed embodiments, monitoring the one or more performance metrics associated with the memory device includes: accessing, by the host service, one or more memory banks of the memory device; and determining, by the host service, a memory usage of the one or more memory banks, the memory usage indicating a frequency in which the memory device is accessed.

In one or more of the disclosed embodiments, the method further includes: modifying, by the host service and via the side-band bus, the one or more power controller parameters based on the power configuration profile, wherein modifying the one or more power controller parameters comprises: accessing, by the host service, a memory of the power controller via the side-band bus; and storing, by the host service, one or more commands associated with the power configuration profile into the memory of the power controller.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
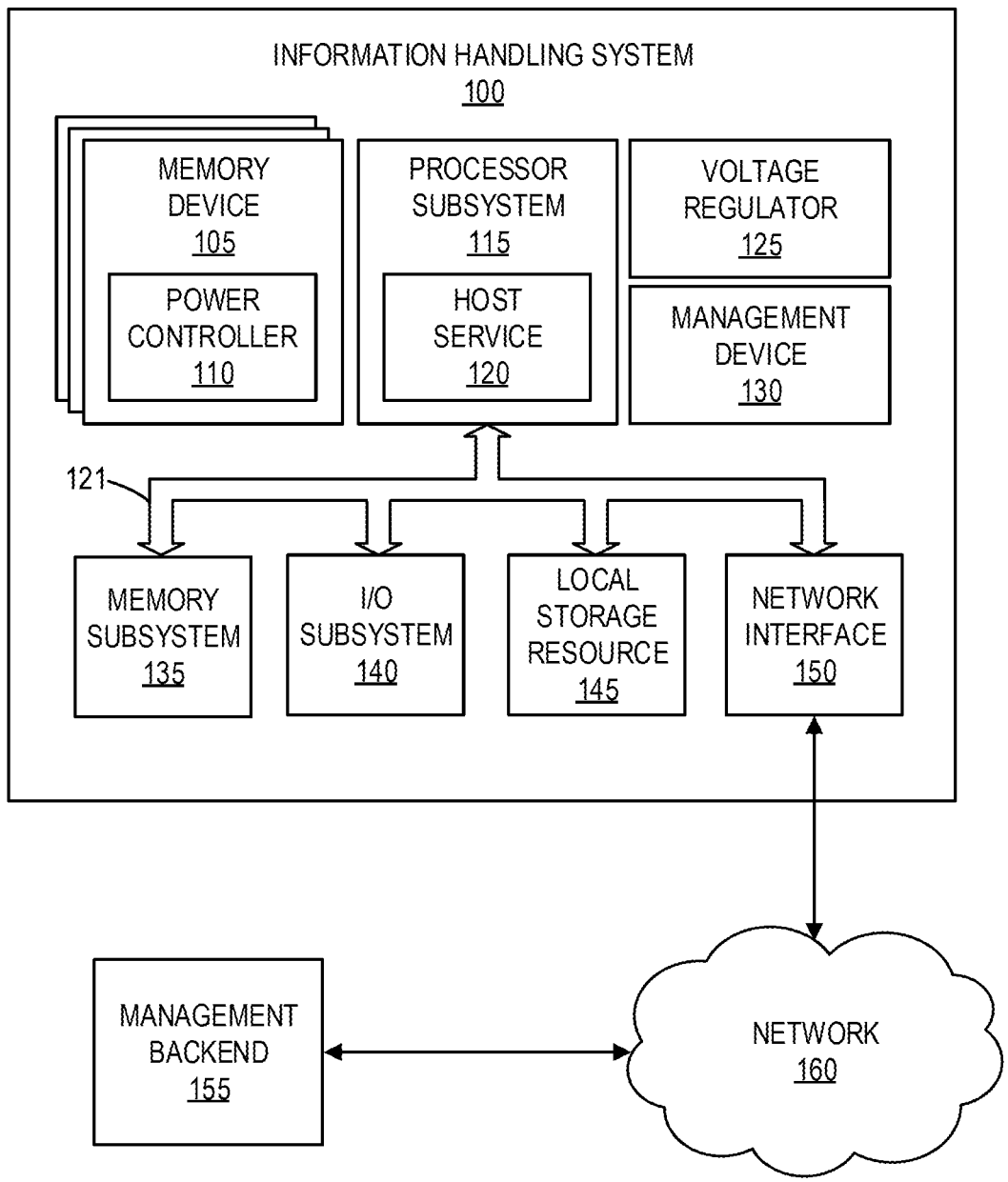
FIG. 1 is a block diagram of selected elements of an embodiment of a computing environment that includes an information handling system and a management backend.

This document describes a method for increasing power efficiency for an information handling system that includes:

monitoring, by a host service of a processor subsystem of the information handling system, one or more performance metrics associated with a memory device of the information handling system, the memory device including a power controller communicably coupled to a management device of the information handling system via a side-band bus; predicting, by the host service, an energy requirement for the memory device based on the one or more performance metrics; generating, by the host service, a power configuration profile based on the energy requirement, the power configuration profile indicating one or more power controller parameters associated with the power controller; sending, by the host service, the power configuration profile to the management device; receiving, by the management device, the power configuration profile; and modifying, by the management device and via the side-band bus, the one or more power controller parameters based on the power configuration profile to cause an increased power efficiency for the information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Figure 2:
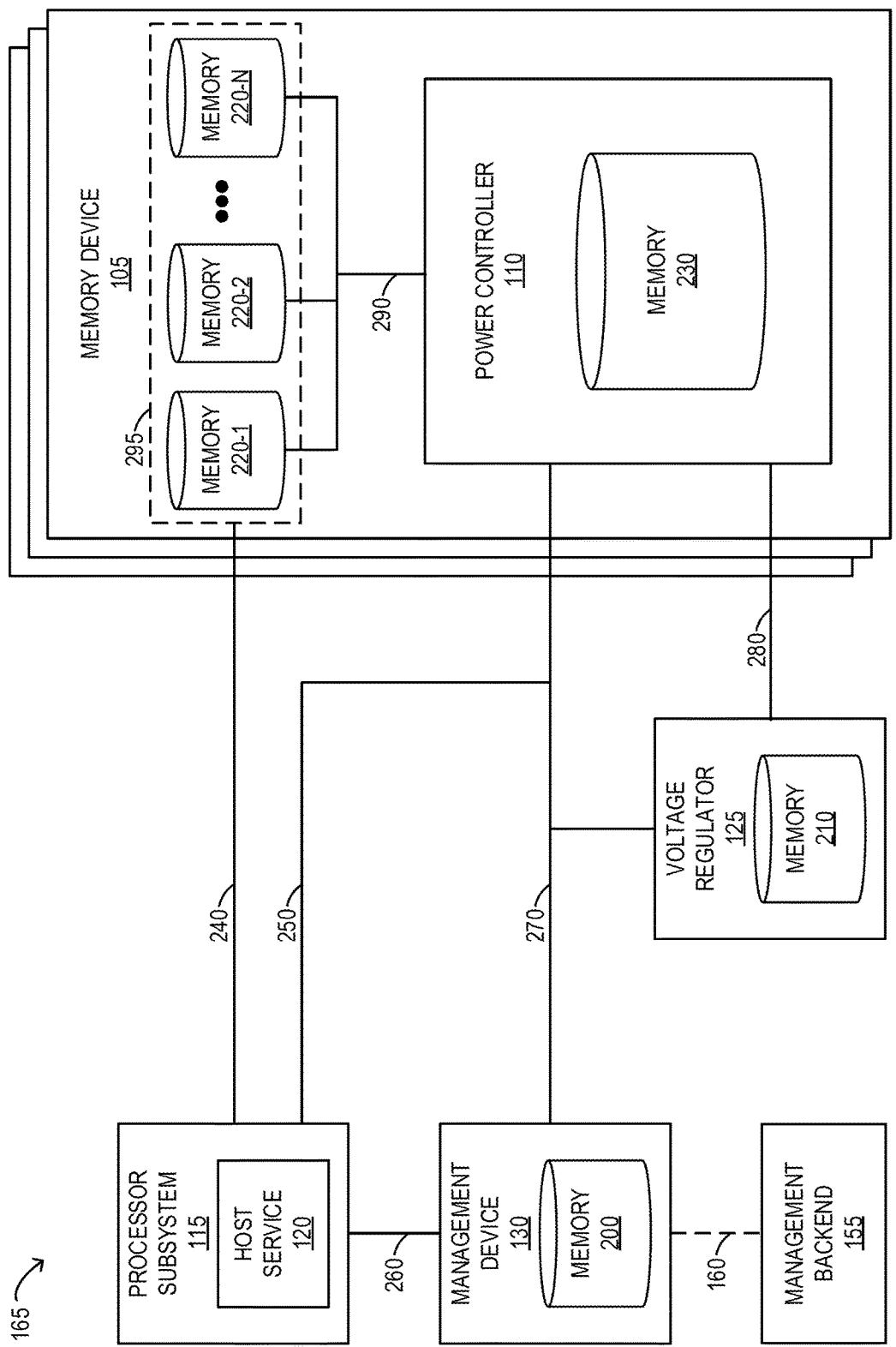
FIG. 2 is a block diagram of selected elements of an embodiment of an information handling system.
Figure 3:
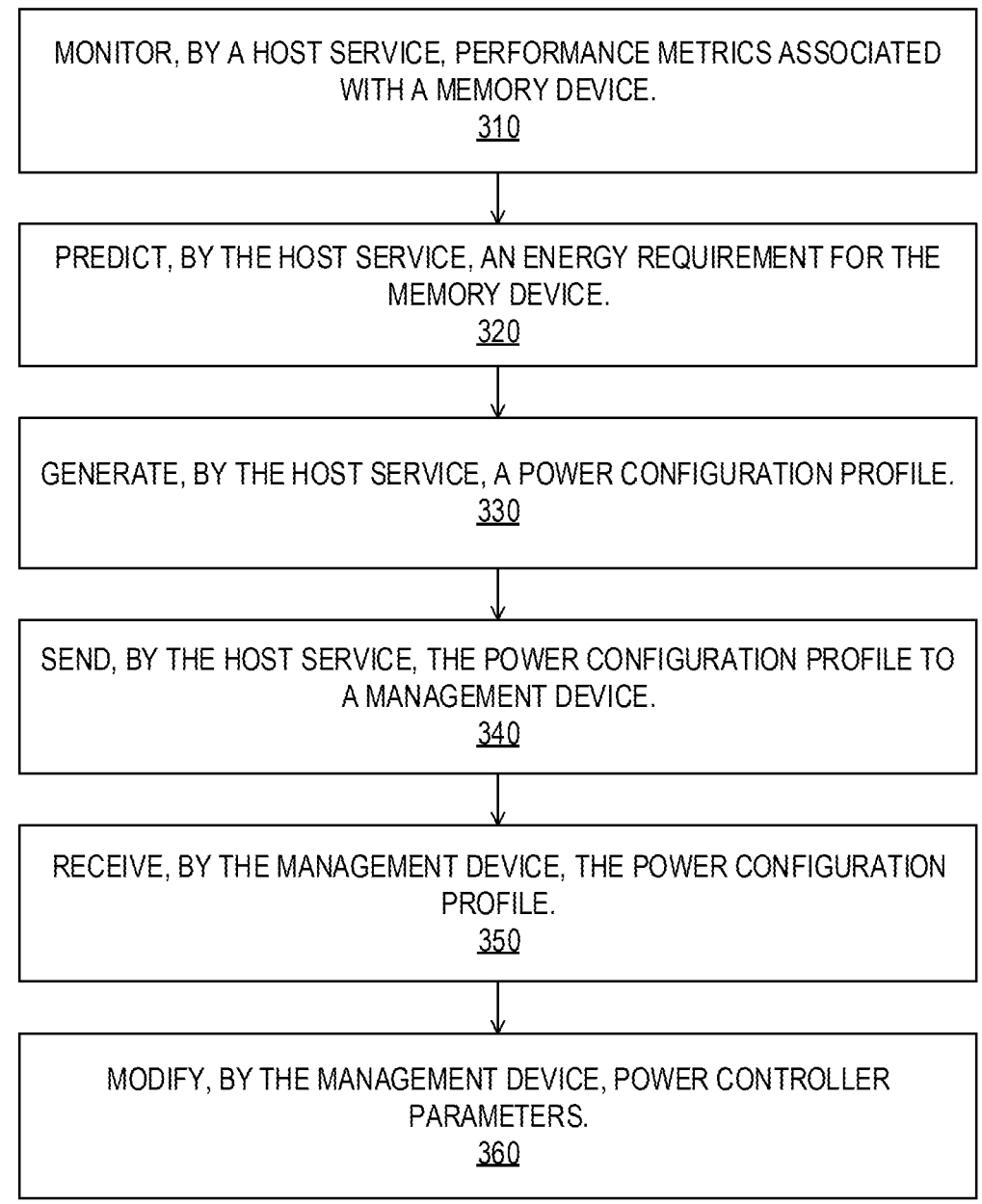
FIG. 3 is a flowchart depicting selected elements of an embodiment of a method for increasing power efficiency for an information handling system.

Particular embodiments are best understood by reference to FIGS. 1-3 wherein like numbers are used to indicate like and corresponding parts.

Turning now to the drawings, FIG. 1 is a block diagram of selected elements of an embodiment of a computing environment that includes an information handling system and a management backend. Specifically, FIG. 1 illustrates a block diagram depicting selected elements of an information handling system 100 in accordance with some embodiments of the present disclosure. In other embodiments, information handling system 100 may represent different types of portable information handling systems, such as, display devices, head mounted displays, head mount display systems, smart phones, tablet computers, notebook computers, media players, foldable display systems, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems.

In the embodiment illustrated in FIG. 1, components of information handling system 100 may include, but are not limited to, a processor subsystem 115, which may comprise one or more processors, and system bus 121 that communicatively couples various system components to processor subsystem 115 including, for example, a memory subsystem 135, an I/O subsystem 140, a local storage resource 145, and a network interface 150. Processor subsystem 115 may include a host service 120. System bus 121 may represent a variety of suitable types of bus structures (e.g., a memory bus, a peripheral bus, or a local bus) using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. As shown in FIG. 1, information handling system 100 may additionally include a memory device 105, a voltage regulator 125, and a management device 130. Memory device 105 may include a power controller 110.

In information handling system 100, processor subsystem 115 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 115 may interpret and/or execute program instructions and/or process data stored locally (e.g., in memory subsystem 135 and/or another component of information handling system 100). In the same or alternative embodiments, processor subsystem 115 may interpret and/or execute program instructions and/or process data stored remotely. In one embodiment, processor subsystem 115 may be or include a multi-core processor comprised of one or more processing cores disposed upon an integrated circuit (IC) chip. In other embodiments, processor subsystem 115 may be or include an integrated device (e.g., microcontroller, system on a chip (SoC), and the like) that includes memory, peripheral interfaces, and/or other components suitable for interpreting and/or executing program instructions and/or processing data. In the embodiment illustrated in FIG. 1, processor subsystem 115 includes a host service 120.

In one embodiment, host service 120 may be a suitable system, apparatus, or device operable to manage resources for information handling system 100. In particular, host service 120 may be or include a set of instructions electronically stored within information handling system 100 (e.g., stored in local storage resource 145) that allows information handling system 100 to manage various resources and/or perform specific tasks. In one embodiment, host service 120 may be or include system software used by information handling system 100 to manage resources. Specifically, host service 120 may be or include system software used to monitor the performance, or "performance metrics," associated with a memory device (e.g., memory device 105) of information handling system 100 and to predict an energy requirement for the memory device based on the performance metrics. In this embodiment, host service 120 may use a trained artificial intelligence (AI) and/or machine learning (ML) model to predict the energy requirement based on the monitored performance metrics. Host service 120 may additionally generate a power usage policy, or a "power configuration profile," for the memory device based on the predicted energy requirement. The power configuration profile may be used to modify operating parameters for the memory device to support an increased overall power efficiency of information handling system 100. In another embodiment, host service 120 may be or include an operating system (OS) used by information handling system 100 to manage memory allocation, schedule tasks, and/or provide services for applications executing on information handling system 100. In yet another embodiment, host service 120 may be or include system firmware used by information handling system 100 to perform specific tasks. For example, host service 120 may be or include Basic Input/Output System (BIOS) firmware used by information handling system 100 to perform hardware initialization during a booting process and/or to provide runtime services for other host services executing on information handling system 100. Host service 120 is described in further detail with respect to FIG. 2.

In one embodiment, memory subsystem 135 may comprise a system, device, or apparatus operable to retain and/or retrieve program instructions and/or data for a period of time (e.g., computer-readable media). Memory subsystem 135 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In one embodiment, I/O subsystem 140 may comprise a system, device, or apparatus generally operable to receive and/or transmit data to, from, and/or within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, a camera, or another type of peripheral device.

In one embodiment, local storage resource 145 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data.

In one embodiment, network interface 150 may be a suitable system, apparatus, or device operable to serve as an interface between information handling system 100 and a network 160. Network interface 150 may enable information handling system 100 to communicate over network 160 using a suitable transmission protocol and/or standard, including, but not limited to, transmission protocols and/or standards enumerated below with respect to the discussion of network 160. Network 160 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a wireless wide area network (WWAN), a virtual private network (VPN), an intranet, the Internet or another appropriate architecture or system that facilitates the communication of signals, data and/or messages (generally referred to as data). Network interface 150 may enable wired and/or wireless communications (e.g., NFC or Bluetooth) to and/or from information handling system 100.

In particular embodiments, network 160 may include one or more routers for routing data between client information handling systems 100 and server information handling systems 100. A device (e.g., a client information handling system 100 or a server information handling system 100) on network 160 may be addressed by a corresponding network address including, for example, an Internet protocol (IP) address, an Internet name, a Windows Internet name service (WINS) name, a domain name or other system name. In particular embodiments, network 160 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

In one embodiment, network 160 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 160 and its various components may be implemented using hardware, software, or any combination thereof.

In one embodiment, each memory device 105 (collectively referred to herein as "memory devices 105") may be a suitable system, apparatus, or device operable to store information associated with information handling system 100. In particular, memory device 105 may be or include one or more memory modules used to store data generated by, or otherwise associated with, information handling system 100. In one embodiment, memory device 105 may be or include one or more dual in-line memory modules (DIMMs), each comprising a series of dynamic random-access memory (DRAM) integrated circuits, or "memory banks" (e.g., memory bank 295 comprised of memory 220-1 through 220-N illustrated in FIG. 2). For example, memory device 105 may be or include one or more Double Data Rate 5 (DDR5) DIMMs configured to reduce power consumption of information handling system 100 while increasing memory bandwidth and overall power efficiency. In another example, memory device 105 may be or include one or more Double Data Rate 4 (DDR4) DIMMs. In yet another embodiment, memory devices 105 may be soldered down on the motherboard of information handling system 100. In other embodiments, memory device 105 may be or include Read Only Memory (ROM), flash memory, and/or any other type of memory operable to store information generated by, or otherwise associated with, with information handling system 100. In the embodiment illustrated in FIG. 1, memory device 105 includes power controller 110. Memory device 105 is described in further detail with respect to FIG. 2.

In one embodiment, each power controller 110 (collectively referred to herein as "power controllers 110") may be a suitable system, apparatus, or device operable to manage resources for memory device 105 in information handling system 100. Specifically, power controller 110 may be or include an electronic hardware device (e.g., an integrated circuit) used to manage power for memory device 105. In one embodiment, each memory device 105 of information handling system 100 may include a respective power controller 110. For example, power controller 110 may be embedded within each memory device 105 such that power controller 110 may perform one or more of DC/DC conversion, battery charging, power-source selection, voltage scaling, power sequencing, and/or other power management functions for memory device 105. In one embodiment, power controller 110 may receive an output voltage (e.g., a bulk voltage) from voltage regulator 125 of information handling system 100. Here, power controller 110 may operate in accordance with one or more parameters, or "power controller parameters," to manage the output voltage from voltage regulator 125 such that the output voltage may be routed to one or more memory banks (e.g., memory bank 295 illustrated in FIG. 2) disposed throughout memory device 105. That is, power controller 110 may operate within one or more power controller parameters to route the output voltage received from voltage regulator 125 throughout memory device 105.

In one embodiment, power controller parameters of power controller 110 may include various thresholds (e.g., overvoltage threshold, low dropout (LDO) threshold, temperature threshold, thermal protection threshold, current limit threshold, voltage limit threshold, and the like) and/or switching frequencies used to manage resources for memory device 105 such that an overall power efficiency of information handling system 100 may be increased. For example, power controller parameters of power controller 110 may specify a switching frequency for one or more metal-oxide-semiconductor field-effect transistors (MOSFETs) and/or driver and MOSFET (DrMOS) modules within power controller 110 (not shown in figure) such that the output voltage of voltage regulator 125 may be stepped-up, stepped-down, and/or otherwise modified by power controller 110 prior to being routed to the memory banks disposed throughout memory device 105. In this example, power controller parameters may specify a switching frequency that supports an increased overall power efficiency, causing a decreased heat dissipation and/or energy loss in, both, power controller 110 and memory device 105.

In one embodiment, power controller parameters of power controller 110 may be determined by one or more devices and/or services of information handling system 100 based on a frequency in which memory device 105 is accessed, or a "memory usage," of memory device 105. Memory usage may additionally be determined based on which memory device 105 (i.e., of memory devices 105) is accessed, operations performed using memory device 105 (e.g., read operations, write operations, and the like), a location of the memory device 105 being accessed, etc. For example, host service 120 may determine the memory usage of an application executing on information handling system 100 and may modify one or more power controller parameters based on the memory usage to support an increased power efficiency. In another example, management device 130 may determine the memory usage and modify the one or more power controller parameters accordingly. In one embodiment, host service 120 and/or management device 130 may access power controller 110 to modify one or more power controller parameters via a side-band bus (e.g., bus 270 shown in FIG. 2) of information handling system 100. In one embodiment, power controller 110 may be or include a power management integrated circuit (PMIC). In other embodiments, power controller 110 may be or include a power management unit (PMU), a system management controller (SMC), a system basis chip (SBC), and/or any combination of electronic hardware devices suitable for managing resources for memory device 105. Power controller 110 is described in further detail with respect to FIG. 2.

In one embodiment, voltage regulator 125 may be a suitable system, apparatus, or device operable to manage, or regulate, an input voltage for power controller 110. In particular, voltage regulator 125 may be or include an electronic hardware device (e.g., an integrated circuit) used to receive a voltage from a power source (e.g., a voltage generator) of information handling system 100 (not shown in figure) and to generate a fixed output voltage of a preset magnitude. The output voltage generated by voltage regulator 125 may remain constant despite changes in magnitude of the voltage received from the power source and may serve as an input voltage for power controller 110. For example, voltage regulator 125 may generate an output voltage ranging from 4.25 to 5.5 volts (V) that may be received by power controller 110 as an input voltage. In one embodiment, voltage regulator 125 may operate in accordance with one or more parameters, or "voltage regulator parameters," to generate the output voltage such that the output voltage may be within a certain voltage range that supports an increased power efficiency for power controller 110. That is, voltage regulator 125 may operate within one or more voltage regulator parameters to generate an output voltage that may serve as an input voltage for power controller 110.

In one embodiment, voltage regulator parameters of voltage regulator 125 may include various thresholds (e.g., input voltage threshold, output voltage threshold, thermal resistance threshold, operating temperature thresholds, dropout voltage thresholds, peak current thresholds, and the like) and/or switching frequencies used to manage resources for memory device 105 such that an overall power efficiency of information handling system 100 may be increased. For example, voltage regulator parameters of voltage regulator 125 may specify a switching frequency for one or more MOSFETs within voltage regulator 125 (not shown in figure) such that the output voltage of voltage regulator 125 may be stepped-up, stepped-down, and/or otherwise modified by voltage regulator 125 prior to being received by power controller 110 as input voltage. In this example, voltage regulator parameters may specify a switching frequency that supports an increased overall power efficiency, causing a decreased heat dissipation and/or energy loss in, both, power controller 110 and memory device 105.

In one embodiment, voltage regulator parameters of voltage regulator 125 may be determined by one or more devices and/or services of information handling system 100 based on memory usage. For example, host service 120 may determine the memory usage as described above and may determine one or more voltage regulator parameters based on the memory usage to support an increased power efficiency. In another example, management device 130 may determine the memory usage and may modify the one or more voltage regulator parameters accordingly. In one embodiment, management device 130 may access voltage regulator 125 to modify one or more voltage regulator parameters via a side-band bus (e.g., bus 270 shown in FIG. 2) of information handling system 100. In one embodiment, voltage regulator 125 may be or include a linear voltage regulator (e.g., series voltage regulator, shunt voltage regulator, and the like). In another embodiment, voltage regulator 125 may be or include a switching voltage regulator (e.g., step up voltage regulator, step down voltage regulator, inverter voltage regulator, and the like). In other embodiments, voltage regulator 125 may be or include any combination of voltage regulators suitable for managing, or regulating, an input voltage for power controller 110. Voltage regulator 125 is described in further detail with respect to FIG. 2.

In one embodiment, management device 130 may be a suitable system, apparatus, or device operable to monitor a physical state of information handling system 100. In particular, management device 130 may be or include an electronic hardware device used to monitor physical parameters of information handling system 100 (e.g., power supply voltage, fan speed, humidity, ambient temperature, and the like). In one embodiment, management device 130 may additionally include circuitry (e.g., processor, memory, network interface, and the like) that allows management device 130 to communicate with one or more additional information handling systems and/or an administrator of computing environment 165. For example, management device 130 may notify an administrator of computing environment 165 of events in which physical parameters of information handling system 100 are above or below permissible limits. In one embodiment, management device 130 may include system software used to monitor performance metrics associated with a memory device (e.g., memory device 105) of information handling system 100 and to predict an energy requirement for the memory device based on the performance metrics. In this embodiment, management device 130 may additionally generate a power configuration profile for the memory device based on the predicted energy requirement. The power configuration profile may be used to modify operating parameters for the memory device to support an increased overall power efficiency of information handling system 100.

In one embodiment, management backend 155 may be a suitable system, apparatus, or device operable to provide an interface through which a user may communicate with information handling system 100. Specifically, management backend 155 may be or include an information handling system communicably coupled to information handling system 100 via network 160 such that a user (e.g., an administrator) of management backend 155 may remotely access and monitor physical parameters of information handling system 100 (e.g., power supply voltage, fan speed, humidity, ambient temperature, and the like). In one embodiment, management backend 155 may access one or more devices, buses, and/or portions of information handling system 100. In particular, management backend 155 may access management device 130 via network 160 to perform a management information exchange with information handling system 100. In one embodiment, the management information exchange may be based at least on an Intelligent Platform Management Interface (IPMI) standard. For example, management backend 155 may permit utilization of IPMI out-of-band interfaces such as IPMI Over LAN (local area network). In another example, the management information exchange may be based on a Redfish standard.

In one embodiment, management backend 155 may include system software used to monitor performance metrics associated with a memory device (e.g., memory device 105) of information handling system 100 via network 160 and to predict an energy requirement for the memory device based on the performance metrics. In this embodiment, management backend 155 may additionally generate a power configuration profile for the memory device based on the predicted energy requirement. The power configuration profile may be used to modify operating parameters for the memory device via network 160 to support an increased overall power efficiency of information handling system 100.

FIG. 2 is a block diagram of selected elements of an embodiment of an information handling system. In the embodiment illustrated in FIG. 2, processor subsystem 115 may be communicably coupled to memory device 105 via bus 240. In this embodiment, bus 240 may support in-band communication between processor subsystem 115 and memory device 105. Similarly, processor subsystem 115 may be communicably coupled to management device 130 via bus 260. In one embodiment, bus 260 may be or include a System Management Bus (SMBus) through which host service 120 may communicate with management device 130. In another embodiment, bus 260 may be or include an Enhanced Serial Peripheral Interface (eSPI). As shown in FIG. 2, power controller 110 may be located onboard memory device 105. Management device 130 may be communicably coupled to power controller 110 via bus 270. Similarly, management device 130 may be communicably coupled to voltage regulator 125 via bus 270. Bus 270 may provide management device 130 with side-band access to, both, voltage regulator 125 and power controller 110. In addition, bus 270 may provide host service 120 with side-band access to power controller 110. In particular, bus 250—communicably coupled to host service 120—may include one or more multiplexer circuits disposed proximate to the intersection of bus 250 and bus 270 (shown in FIG. 2) such that host service 120 may access power controller 110 (i.e., via busses 250 and 270). In one embodiment, bus 270 may be or include a Power Management Bus (PMBus). In another embodiment, bus 270 may be or include an Intelligent Platform Management Interface (IPMI) bus. In yet another embodiment, bus 270 may be or include an Inter-Integrated Circuit (I2C) bus. Management device 130 may additionally be coupled to management backend 155 via network 160 (shown in FIG. 1 and represented as dotted line 160 in FIG. 2). In addition, voltage regulator 125 may be communicably coupled to power controller 110 via bus 280.

In the embodiment illustrated in FIG. 2, host service 120 may monitor performance metrics associated with memory device 105. As described above with respect to FIG. 1, host service 120 may be or include system software used to monitor performance metrics associated with memory device 105. In one embodiment, host service 120 may monitor performance metrics associated with memory device 105 by accessing one or more performance counters associated with memory device 105 and determining a memory usage of memory device 105 based on the performance counters. For example, host service 120 may be or include performance counter software used to monitor, count, and/or measure a frequency in which memory device 105 is accessed by an application executing on information handling system 100. In another embodiment, host service 120 may monitor performance metrics associated with memory device 105 by accessing one or more memory banks of memory device 105 and determining a memory usage of the one or more memory banks. For example, host service 120 may access memory bank 295 of memory device 105 via bus 240 to monitor, count, and/or measure a frequency in which memory bank 295 (i.e., memory 220-1 through 220-N) is accessed. In other embodiments, host service 120 may monitor performance metrics associated with memory device 105 by using a trained AI and/or ML model, using telemetry data collected by one or more sensors disposed throughout information handling system 100 and/or computing environment 165, monitoring one or more registers of memory device 105, analyzing one or more services of an OS executing on information handling system 100 and/or management backend 155, and/or using any suitable combination of the methods described above. In one embodiment, management device 130 may monitor performance metrics associated with memory device 105 in addition, or alternatively, to host service 120.

In one embodiment, host service 120 may predict an energy requirement for memory device 105 and may generate a power configuration profile based on the energy requirement. Here, host service 120 may use a trained artificial AI and/or ML model to predict the energy requirement based on monitored performance metrics. The energy requirement may specify one or more anticipated, or predicted, power requirements of memory device 105 based on a current, and/or previous, memory usage (i.e., performance metrics) such that an overall power efficiency of information handling system 100 may be increased. The power configuration profile generated by host service 120 based on the energy requirement may indicate one or more power controller parameters associated with this increased power efficiency. That is, the one or more power controller parameters specified in the power configuration profile may be used, or applied, by power controller 110 to achieve an increased overall power efficiency of information handling system 100. For example, the energy requirement for memory device 105 may specify an input voltage and/or current required for power controller 110 to supply memory bank 295 with adequate power to support an application executing on information handling system 100 without generating excess heat dissipation. In this example, the power configuration profile generated by host service 120 may include a numeric value, or values, indicating an input voltage and/or current for power controller 110 in accordance with the predicted energy requirement. In another example, the energy requirement may specify one or more switching frequencies required for power controller 110 to route power to memory bank 295 via power rails 290 such that one or more MOSFETs and/or DrMOS modules within power controller 110 may experience minimal switching losses. In this example, the power configuration profile generated by host service 120 may include a numeric value, or values, indicating one or more switching frequencies for power controller 110 in accordance with the predicted energy requirement. In one embodiment, management device 130 may predict an energy requirement and generate a power configuration profile for memory device 105 in addition, or alternatively, to host service 120.

Once the power configuration profile has been generated, host service 120 may send the power configuration profile to management device 130. In one embodiment, host service 120 may access management device 130 via bus 260 and may store the power configuration profile in memory 200 of management device 130. In another embodiment, management device 130 may receive the power configuration profile via bus 260 and may store the power configuration profile in memory 200. In yet another embodiment, host service 120 may prompt an Advanced Configuration and Power Interface (ACPI) event to wake a Device Specific Method (DSM) such that a DSM handler may send an out-of-band command to management device 130. In this embodiment, management device 130 may translate the command into a power configuration profile accordingly. In one embodiment, host service 120 may be executed on management backend 155 such that management backend 155 may monitor performance metrics associated with memory device 105 via network 160 and may predict an energy requirement for memory device 105 based on the performance metrics. In this embodiment, management backend 155 may additionally generate a power configuration profile for memory device 105 based on the predicted energy requirement as described above.

In one embodiment, management device 130 may modify one or more power controller parameters of power controller 110 based on the power configuration profile (e.g., stored in memory 200). Specifically, management device 130 may access memory 230 of power controller 110 via bus 270 and may store one or more commands associated with the power configuration profile into memory 230. Here, bus 270 may provide management device 130 with side-band access to power controller 110 and memory 230 therein. In one embodiment, commands associated with the power configuration profile may modify, or cause power controller 110 to modify, one or more power controller parameters in accordance with the one or more power controller parameters specified in the power configuration profile. The one or more power controller parameters specified in the power configuration profile may be used, or applied, by power controller 110 according to the one or more commands to achieve an increased overall power efficiency of information handling system 100. For example, management device 130 may modify, or cause power controller 110 to modify, an input voltage and/or current required to supply memory bank 295 with adequate power to support an application executing on information handling system 100 without generating excess heat dissipation. In another example, management device 130 may modify, or cause power controller 110 to modify, one or more switching frequencies required for routing power to memory bank 295 via power rails 290 such that one or more MOSFETs within power controller 110 may experience minimal switching losses. Other examples of one or more power controller parameters that may be modified include overvoltage threshold, low dropout (LDO) threshold, temperature threshold, thermal protection threshold, current limit threshold, voltage limit threshold, and/or any suitable combination of parameters associated with an efficient operation of power controller 110.

In one embodiment, host service 120 may modify, or cause power controller 110 to modify, one or more power controller parameters of power controller 110 in addition, or alternatively, to management device 130. In particular, host service 120 may access memory 230 of power controller 110 via busses 250 and 270 (i.e., using one or more multiplexer circuits disposed proximate to the intersection of bus 250 and bus 270) and may store one or more commands associated with the power configuration profile into memory 230 of power controller 110. In this embodiment, the commands associated with the power configuration profile may modify, or cause power controller 110 to modify, one or more power controller parameters in accordance with the one or more power controller parameters specified in the power configuration profile as described above.

In one embodiment, management device 130 may modify one or more voltage regulator parameters of voltage regulator 125. Specifically, management device 130 may access memory 210 of voltage regulator 125 via bus 270 and may store one or more commands associated with the power configuration profile into memory 210. In one embodiment, commands associated with the power configuration profile may modify, or cause voltage regulator 125 to modify, one or more voltage regulator parameters in accordance with one or more voltage regulator parameters specified in the power configuration profile. Here, voltage regulator parameters specified in the power configuration profile may include various thresholds (e.g., input voltage threshold, output voltage threshold, thermal resistance threshold, operating temperature threshold, dropout voltage threshold, peak current threshold, and the like) and/or switching frequencies used to manage resources for memory device 105 such that an overall power efficiency of information handling system 100 may be increased.

In one embodiment, management device 130 may identify an output voltage of voltage regulator 125 and may determine that the output voltage is outside of a threshold output voltage (e.g., as indicated in power configuration profile). For example, management device 130 may monitor the output voltage of voltage regulator 125 via bus 280 in a feedback loop. In response to determining that the output voltage is outside of a threshold output voltage, management device 130 may then modify, or cause voltage regulator 125 to modify, one or more voltage regulator parameters of voltage regulator 125 to cause an increase or decrease in the output voltage, thereby increasing the overall power efficiency of information handling system 100. That is, management device 130 may modify, or cause voltage regulator 125 to modify, one or more voltage regulator parameters of voltage regulator 125 in accordance with the one or more voltage regulator parameters specified in the power configuration profile. For example, voltage regulator parameters of voltage regulator 125 may specify a switching frequency for one or more MOSFETs and/or DrMOS modules within voltage regulator 125 such that the output voltage of voltage regulator 125 may be stepped-up, stepped-down, and/or otherwise modified by voltage regulator 125 prior to being received by power controller 110 as input voltage via bus 280 to decrease heat dissipation and/or energy loss for, both, power controller 110 and memory device 105. Other examples of one or more voltage regulator parameters that may be modified include input voltage threshold, output voltage threshold, thermal resistance threshold, operating temperature threshold, dropout voltage threshold, peak current threshold, and/or any suitable combination of parameters associated with an efficient operation of voltage regulator 125. By modifying one or more voltage regulator parameters in addition to one or more power controller parameters, management device 130 may manage voltage regulator 125 and power controller 110 in tandem to ensure that an optimal output voltage range (e.g., 4.5V to 5V) is received by power controller 110 as input voltage. In this way, management device 130 may tune respective operating parameters for voltage regulator 125 and power controller 110 to achieve optimal overall power efficiency.

FIG. 3 is a flowchart depicting selected elements of an embodiment of a method for increasing power efficiency for an information handling system. It is noted that certain operations described in method 300 may be optional or may be rearranged in different embodiments.

Method 300 may begin at step 310, where a host service of a processor subsystem of the information handling system may monitor one or more performance metrics associated with a memory device of the information handling system. The memory device may include a power controller communicably coupled to a management device of the information handling system via a side-band bus. For example, host service 120 may monitor performance metrics associated with memory device 105 by accessing one or more performance counters associated with memory device 105 and determining a memory usage of memory device 105 based on the performance counters as described above with respect to FIG. 2. In another example, host service 120 may access memory bank 295 of memory device 105 via bus 240 to monitor, count, and/or measure a frequency in which memory bank 295 is accessed as described above with respect to FIG. 2. As shown in FIG. 2, memory device 105 includes power controller 110 (i.e., located onboard memory device 105) that is communicably coupled to management device 130 via bus 270. In steps 320 and 330, the host service may predict an energy requirement for the memory device based on the one or more performance metrics and may generate a power configuration profile based on the energy requirement. The power configuration profile may indicate one or more power controller parameters associated with the power controller. For example, host service 120 may use a trained artificial AI and/or ML model to predict the energy requirement based on monitored performance metrics as described above with respect to FIG. 2. The energy requirement may specify one or more anticipated, or predicted, power requirements of memory device 105 based on a current, and/or previous, memory usage (i.e., performance metrics) such that an overall power efficiency of information handling system 100 may be increased. The power configuration profile generated by host service 120 based on the energy requirement may indicate one or more power controller parameters associated with power controller 110 as described above with respect to FIG. 2. In steps 340 and 350, the host service may send the power configuration profile to a management device of the information handling system and the management device may receive the power configuration profile. For example, host service 120 may access management device 130 via bus 260 and may store the power configuration profile in memory 200 of management device 130 or management device 130 may receive the power configuration profile via bus 260 and may store the power configuration profile in memory 200 as described above with respect to FIG. 2. In step 360, the management device may modify the one or more power controller parameters via the side-band bus based on the power configuration profile. For example, management device 130 may access memory 230 of power controller 110 via bus 270 and may store one or more commands associated with the power configuration profile into memory 230 as described above with respect to FIG. 2. Commands associated with the power configuration profile may modify, or cause power controller 110 to modify, one or more power controller parameters in accordance with the one or more power controller parameters specified in the power configuration profile to cause an increased power efficiency for information handling system 100.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method for increasing power efficiency for an information handling system, the method comprising:

monitoring, by a host service of a processor subsystem of the information handling system, one or more performance metrics associated with a memory device of the information handling system, the memory device including a power controller communicably coupled to a management device of the information handling system via a side-band bus;

predicting, by the host service, an energy requirement for the memory device based on the one or more performance metrics;

generating, by the host service, a power configuration profile based on the energy requirement, the power configuration profile indicating one or more power controller parameters associated with the power controller, the one or more power controller parameters including one or more switching frequencies for the power controller;

sending, by the host service, the power configuration profile to the management device;

receiving, by the management device, the power configuration profile;

identifying, by the management device, an output voltage of a voltage regulator of the information handling system, the voltage regulator communicably coupled to the power controller;

determining, by the management device, that the output voltage is outside of an operating temperature threshold; and in response to determining that the output voltage is outside of the operating temperature threshold, modifying, by the management device and via the side-band bus, the one or more power controller parameters based on the power configuration profile to cause an increased power efficiency for the information handling system, including stepping-up and/or stepping-down the one or more switching frequencies for the power controller such that the power controller experiences minimal switching losses and such that the power controller and memory device experience a decreased heat dissipation.

2. The method of claim 1, wherein modifying the one or more power controller parameters comprises:

accessing, by the management device, a memory of the power controller via the side-band bus; and storing, by the management device, one or more commands associated with the power configuration profile into the memory of the power controller.

3. The method of claim 1, wherein modifying the one or more voltage regulator parameters comprises:

accessing, by the management device, a memory of the voltage regulator via the side-band bus; and storing, by the management device, one or more commands associated with the power configuration profile into the memory of the voltage regulator.

4. The method of claim 1, wherein monitoring the one or more performance metrics associated with the memory device comprises:

accessing, by the host service, one or more performance counters associated with the memory device; and determining, by the host service, a memory usage of the memory device based on the performance counters, the memory usage indicating a frequency in which the memory device is accessed.

5. The method of claim 1, wherein monitoring the one or more performance metrics associated with the memory device comprises:

accessing, by the host service, one or more memory banks of the memory device; and determining, by the host service, a memory usage of the one or more memory banks, the memory usage indicating a frequency in which the memory device is accessed.

6. The method of claim 1, further comprising:

modifying, by the host service and via the side-band bus, the one or more power controller parameters based on the power configuration profile, wherein modifying the one or more power controller parameters comprises:

accessing, by the host service, a memory of the power controller via the side-band bus; and storing, by the host service, one or more commands associated with the power configuration profile into the memory of the power controller.

7. One or more computer-readable non-transitory storage media embodying software that is operable when executed to:

monitor, by a host service of a processor subsystem of an information handling system, one or more performance metrics associated with a memory device of the information handling system, the memory device including a power controller communicably coupled to a management device of the information handling system via a side-band bus;

predict, by the host service, an energy requirement for the memory device based on the one or more performance metrics;

generate, by the host service, a power configuration profile based on the energy requirement, the power configuration profile indicating one or more power controller parameters associated with the power controller, the one or more power controller parameters including one or more switching frequencies for the power controller;

send, by the host service, the power configuration profile to the management device;

receive, by the management device, the power configuration profile;

identify, by the management device, an output voltage of a voltage regulator of the information handling system, the voltage regulator communicably coupled to the power controller;

determine, by the management device, that the output voltage is outside of an operating temperature threshold; and in response to determining that the output voltage is outside of the operating temperature threshold, modify, by the management device and via the side-band bus, the one or more power controller parameters based on the power configuration profile to cause an increased power efficiency for the information handling system, including stepping-up and/or stepping-down the one or more switching frequencies for the power controller such that the power controller experiences minimal switching losses and such that the power controller and memory device experience a decreased heat dissipation.

8. The media of claim 7, wherein to modify the one or more power controller parameters, the software is further operable when executed to:

access, by the management device, a memory of the power controller via the side-band bus; and store, by the management device, one or more commands associated with the power configuration profile into the memory of the power controller.

9. The media of claim 7, wherein to modify the one or more voltage regulator parameters, the software is further operable when executed to:

access, by the management device, a memory of the voltage regulator via the side- band bus; and store, by the management device, one or more commands associated with the power configuration profile into the memory of the voltage regulator.

10. The media of claim 7, wherein to monitor the one or more performance metrics associated with the memory device, the software is further operable when executed to:

access, by the host service, one or more performance counters associated with the memory device; and determine, by the host service, a memory usage of the memory device based on the performance counters, the memory usage indicating a frequency in which the memory device is accessed.

11. The media of claim 7, wherein to monitor the one or more performance metrics associated with the memory device, the software is further operable when executed to:

access, by the host service, one or more memory banks of the memory device; and determine, by the host service, a memory usage of the one or more memory banks, the memory usage indicating a frequency in which the memory device is accessed.

12. The media of claim 7, wherein the software is further operable when executed to:

modify, by the host service and via the side-band bus, the one or more power controller parameters based on the power configuration profile, wherein to modify the one or more power controller parameters, the software is further operable when executed to:

access, by the host service, a memory of the power controller via the side-band bus; and store, by the host service, one or more commands associated with the power configuration profile into the memory of the power controller.

13. A computing environment, comprising:

an information handling system including one or more processors; and one or more computer-readable non-transitory storage media coupled to one or more of the processors and comprising instructions operable when executed by one or more of the processors to cause the system to:

monitor, by a host service of a processor subsystem of the information handling system, one or more performance metrics associated with a memory device of the information handling system, the memory device including a power controller communicably coupled to a management device of the information handling system via a side-band bus;

predict, by the host service, an energy requirement for the memory device based on the one or more performance metrics;

generate, by the host service, a power configuration profile based on the energy requirement, the power configuration profile indicating one or more power controller parameters associated with the power controller, the one or more power controller parameters including one or more switching frequencies for the power controller;

send, by the host service, the power configuration profile to the management device;

receive, by the management device, the power configuration profile;

identify, by the management device, an output voltage of a voltage regulator of the information handling system, the voltage regulator communicably coupled to the power controller;

determining, by the management device, that the output voltage is outside of an operating temperature threshold; and in response to determining that the output voltage is outside of the operating temperature threshold, modify, by the management device and via the side-band bus, the one or more power controller parameters based on the power configuration profile to cause an increased power efficiency for the information handling system, including stepping-up and/or stepping-down the one or more switching frequencies for the power controller such that the power controller experiences minimal switching losses and such that the power controller and memory device experience a decreased heat dissipation.

14. The computing environment of claim 13, wherein to modify the one or more power controller parameters, the processors are further operable when executed to:

access, by the management device, a memory of the power controller via the side- band bus; and store, by the management device, one or more commands associated with the power configuration profile into the memory of the power controller.

15. The computing environment of claim 13, wherein to modify the one or more voltage regulator parameters, the processors are further operable when executed to:

access, by the management device, a memory of the voltage regulator via the side-band bus; and store, by the management device, one or more commands associated with the power configuration profile into the memory of the voltage regulator.

16. The computing environment of claim 13, wherein to monitor the one or more performance metrics associated with the memory device, the processors are further operable when executed to:

access, by the host service, one or more performance counters associated with the memory device; and determine, by the host service, a memory usage of the memory device based on the performance counters, the memory usage indicating a frequency in which the memory device is accessed.

17. The computing environment of claim 13, wherein to monitor the one or more performance metrics associated with the memory device, the processors are further operable when executed to:

access, by the host service, one or more memory banks of the memory device; and determine, by the host service, a memory usage of the one or more memory banks, the memory usage indicating a frequency in which the memory device is accessed.

* * * * *